United States Patent [19]
Kunold

[11] Patent Number: 5,144,569
[45] Date of Patent: Sep. 1, 1992

[54] METHOD FOR FILTERING DIGITIZED SIGNALS EMPLOYING ALL-PASS FILTERS

[75] Inventor: Ingo Kunold, Borchen, Fed. Rep. of Germany

[73] Assignee: Nixdorf Computer AG, Paderborn, Fed. Rep. of Germany

[21] Appl. No.: 548,124

[22] Filed: Jul. 5, 1990

[30] Foreign Application Priority Data

Jul. 7, 1989 [DE] Fed. Rep. of Germany ....... 3922469

[51] Int. Cl.$^5$ .............................................. G06F 15/31
[52] U.S. Cl. ................................................ 364/724.01
[58] Field of Search ....................... 364/724.01, 724.15, 364/724.06

[56] References Cited

U.S. PATENT DOCUMENTS 4,566,119  1/1986  Peters .
4,825,396  4/1989  Gazsi ............................ 364/724.15

FOREIGN PATENT DOCUMENTS 3627676  2/1988  Fed. Rep. of Germany .
3634239  4/1988  Fed. Rep. of Germany .

OTHER PUBLICATIONS

Saramäki, Tapio: "On the Design of Digital Filters as a Sum of Two All-Pass Filters". In: IEEE Transactions on Circuits and Systems, vol. CAS-32, No. 11, Nov. 1985, pp. 1191, 1192.
Jarske, Petri et al.: "Signal Processor Implementation of Variable Digital Filters". In: IEEE Transactions on Instrumentation and Measurement, vol. 37, No. 3, Sep. 1988, pp. 363 to 367.
Patney, Rakesh K. et al.: "A Different Look at Round-off Noise in Digital Filters". In: IEEE Transactions on Circuits and Systems, vol. CAS-27, No. 1, Jan. 1980, pp. 59 to 62.
Regalia, Phillip A.: "Tree-Structured Complementary Filter Using All-Pass Sections". In: IEEE Transactions on Circuits and Systems, vol. CAS-34, No. 12, Dec. 1987, pp. 1470 to 1483.

*Primary Examiner*—Tan V. Mai
*Attorney, Agent, or Firm*—Varnum, Riddering, Schmidt & Howlett

[57] ABSTRACT

A method for filtering digital input signals (e) makes use of all-pass filters of a first-class having the transfer function S1 and all-pass filters of a second-class having the transfer function S2, as well as all-pass filters of higher order, derived therefrom, having the transfer functions S1' and S1" or S2' and S2". The all-pass filters (10 to 36) are arranged in several stages in such a manner that the number of all-pass filters of higher order for a predetermined filter function is reduced. The output signals (A1 to A8) of the all-pass filters of the lowest order (22 to 36) are combined in a logical operation stage to filter output signals (d1,d8), the respective filter characteristic of which is determined by the logical operation. By the method of this invention, the steps necessary for the filtering can be carried out faster than in the prior art.

9 Claims, 5 Drawing Sheets

METHOD FOR FILTERING DIGITIZED SIGNALS EMPLOYING ALL-PASS FILTERS

TECHNICAL FIELD

The present invention relates to a method for filtering digitized signals employing a plurality of all-pass filters and more particularly to such a method in which an input signal is filtered by at least one all-pass filter of a first class and at least one all-pass filter of a second class and of a predetermined lowest order as well as all-pass filters of at least one higher order derived by frequency transformation from filters of lower order.

BACKGROUND ART

A method of the kind mentioned above is known from German patent DE 3,627,676 A1 and is used for filtering a distorted signal, e.g. an audio signal, and to equalize said signal in predetermined frequency ranges. For that purpose, an analog signal is transformed into a sequence of discrete digital values which are filtered and, if desired, thereupon again retransformed into a analog signal. In the processing of the digital values in a digital computer, diametrically opposed demands are made which are difficult to satisfy simultaneously. For instance, the processing speed should be very high in order to enable the real time processing of high-frequency signals. This, however, can only be obtained by using simple filter structures requiring a minor amount of computation. On the other hand, the selectivity of the filter should be high which, in turn, is only possible with complex filter structures, i.e. with filters of a higher order, and with a correspondingly large amount of computation.

In the method described in the aforementioned German patent DE 3,627,676 A1, first-class and second-class all-pass filters are used for the design of so-called wave digital filters. The all-pass filters differ by at least one order, i.e. the second-class all-pass filter has the order of two, when the first-class all-pass filter has the order of 1. But all-pass filters of higher order can also be used. By applying the frequency transformation known from the digital filter technique, all-pass filters for the next higher order from the first-class as well as second-class all-pass filters can be derived, the order of which is determined by the frequency transformation used.

When there is only one first-class and second-class all-pass filter in a filter arrangement, the frequency range defined by the scanning theorem is separated in two sub-bands. When additionally thereto all-pass filters of a higher order are used, the number of the sub-bands is increased and thereby an improved selection of the filtering is achieved. It is commonly known that the amount of computation for the filtering is increased by an all-pass filter of increasing order, since more extensive and consequently more time-consuming computation steps must be carried out than for filters of a lower order. In the known method, for the separation in a predetermined number of identically large sub-bands, the all-pass filters are combined in cascading stages in such a way that the required number of all-pass filters of higher order is larger than the number of all-pass filters of lower order. This results in the fact that the filtering is time-consuming.

SUMMARY OF THE INVENTION

It is therefore the problem of the invention to provide a new method for filtering digitized signals, in which the number of all-pass filters of higher order, required for a predetermined filter function, is reduced.

This problem is solved for a prior art method of the kind mentioned above by the fact that the input signal is fed to an all-pass filter of the first class and an all-pass filter of the second class, both of highest order. The output signal of each is fed to an all-pass filter of the first class and an all-pass filter of the second class, connected directly thereafter, and of the next lower order. This feeding to all-pass filters of the next lower order is repeated until all-pass filters of the lowest order are reached, and only the output signals of the all-pass filters of the lowest order are combined to generate the filter output signal.

In accordance with the invention, after each all-pass filter of the highest order, two all-pass filters of the next lower order are connected, thereafter two all-pass filters of the next lower order, and so on, until all-pass filters of the lowest order are reached. This means that the number of the all-pass filters with decreasing order increases. For the method according to the invention, the total number of all-pass filters to be used for the filtering remains as large as for the known method, the number of all-pass filters of higher order, however, is reduced, whereas the number of all-pass filters of lower order is increased. Accordingly, the effort required for the technical realization in a digital computer is shifted from time-consuming multiplication operations to simpler and faster summation and difference operations, while maintaining the filter effect. By this shifting, it is possible to carry out the necessary method steps faster than for the known method, and a higher signal processing speed is obtained.

The filter output signal is generated by the logical formation of the sum and/or difference of the output signals of the all-pass filters of lowest order. With respect to the result of this logical operation, two extreme cases must be distinguished. In one case (transfer range), the output signals sum up to a filter output signal having a value which is proportional to the input signal. In the other case (cut-off range), the output signals sum up to zero, i.e. the input signal is blocked during the filtering and not transferred. These functions are dependent on the frequency of the input signal and result in a certain frequency response of the filter output signal. By varying the logical operation performed on the output signals of the all-pass filters, the filter characteristic of the filter output signal is changed. Therefore it is possible to generate several filter output signals with different frequency responses. When a digital filtering is, for instance, implemented with one first-class and one second-class all-pass filter of higher order, connected to four all-pass filters of the lowest order, output signals are generated by the latter four which can be combined by varying the logical operation to get a maximum of 16 different filter output signals. Several filter characteristics can be obtained e.g. a low-pass filter, a band-pass filter with a first center frequency, a further band-pass filter with a second higher center frequency, a high-pass filter as well as four further filter characteristics which respectively correspond to the aforementioned ones and respectively have filter output signals being phase shifted by 180°.

Furthermore, it is possible to quickly set or change the filter characteristic of a filter output signal. Only in the last procedure step of the filtering process does a corresponding logical operation have to be effected. It is not necessary to change any of the prior steps of the digital filtering process to change the filter characteristic. This means that the all-pass filters remain unchanged. Consequently, it is not necessary for the filter output signal to pass through a transient when its filter characteristic is changed. This characteristic can be advantageously made use of in applications where timing is critical.

In a preferred further development of the invention, the output signals of the all-pass filters of lowest order are weighted with a coefficient, respectively. Thereby it is achieved that, during the digital filtering, the filter characteristic can also be set by changing the coefficient. It is for instance possible to reverse the filter characteristic of a filter output signal from band pass response to band rejection response by changing a coefficient.

In this respect it can be advantageous if the output signal of the all-pass filter of lowest order, to which only all-pass filters of the same class are connected in series, is weighted with a coefficient, the value of which results in zero when added to the coefficients, which are of equal value to each other, by which the remaining output signals are weighted. By these measures, the filter characteristic of a rejection filter is produced, wherein the output signal of either the all-pass filter of the first class or of the second class, being of the lowest order, may be multiplied by a coefficient which differs from the other coefficients.

Moreover it can be useful to selectively invert the output signals of the all-pass filters of the lowest order. By this simple intervention in the filtering process, it is possible to reverse the filter characteristic of a certain filter output signal to its inverse filter characteristic without changing the logical operation. The inverting as well as the weighting is preferably controlled by a filter control. In the control, the possible combinations of the logical operations can, for example, be stored in a table. By access to the control, the desired filter characteristics of the filter output signals can be easily set.

Furthermore, in certain application cases it is useful that the weighting is carried out with equal coefficients, the sum of which equals 1. Thereby the amount of the transfer function for the filter output signals within the transfer range of the filter characteristic equals 1, i.e. input signals and output signals have the same amplitude. Moreover, by taking this measure it is achieved that the filter output signals lie within a predetermined value range and are not distorted.

It is also advantageous if the steps of the filtering process and of the logical operation are carried out by a signal processor. These steps are especially adapted to the data processing course of a signal processor so that the processing speed for the filtering is further increased. Above all, a signal processor having an arithmetic unit which can carry out multiple additions is most suitable. Such arithmetic operations occur during logical operation of the output signals of the all-pass filters of lowest order with the filter output signal. By this the speed of the signal processing for filtering is further increased.

BRIEF DESCRIPTION OF THE DRAWINGS

Embodiments of the invention will now be described with reference to the accompanying drawings in which

In FIG. 1 an embodiment of the invention is schematically represented in a block diagram. Several all-pass filters 10 to 36 are interconnected in three stages, with a logical operation stage following thereupon. The all-pass filters 10 to 36, the design of which is explained later, each have an input terminal and an output terminal which, for reasons of clarity, are indicated with 38 or 40 for the all-pass filter 22 only. There are two classes of all-pass filters, first-class all-pass filters, the transfer function of which is designated as S1, as well as second-class all-pass filters, the transfer function of which is designated as S2. From these all-pass filters, the order of which is 1 or even larger, all-pass filters of a higher order are derived by means of conventional transformation rules also referred to as frequency transformation. The transfer functions of derived all-pass filters are designated as S1' or S2' when the frequency transformation is used once and as S1'' or S2'' when the frequency transformation is used twice.

Figure 1:
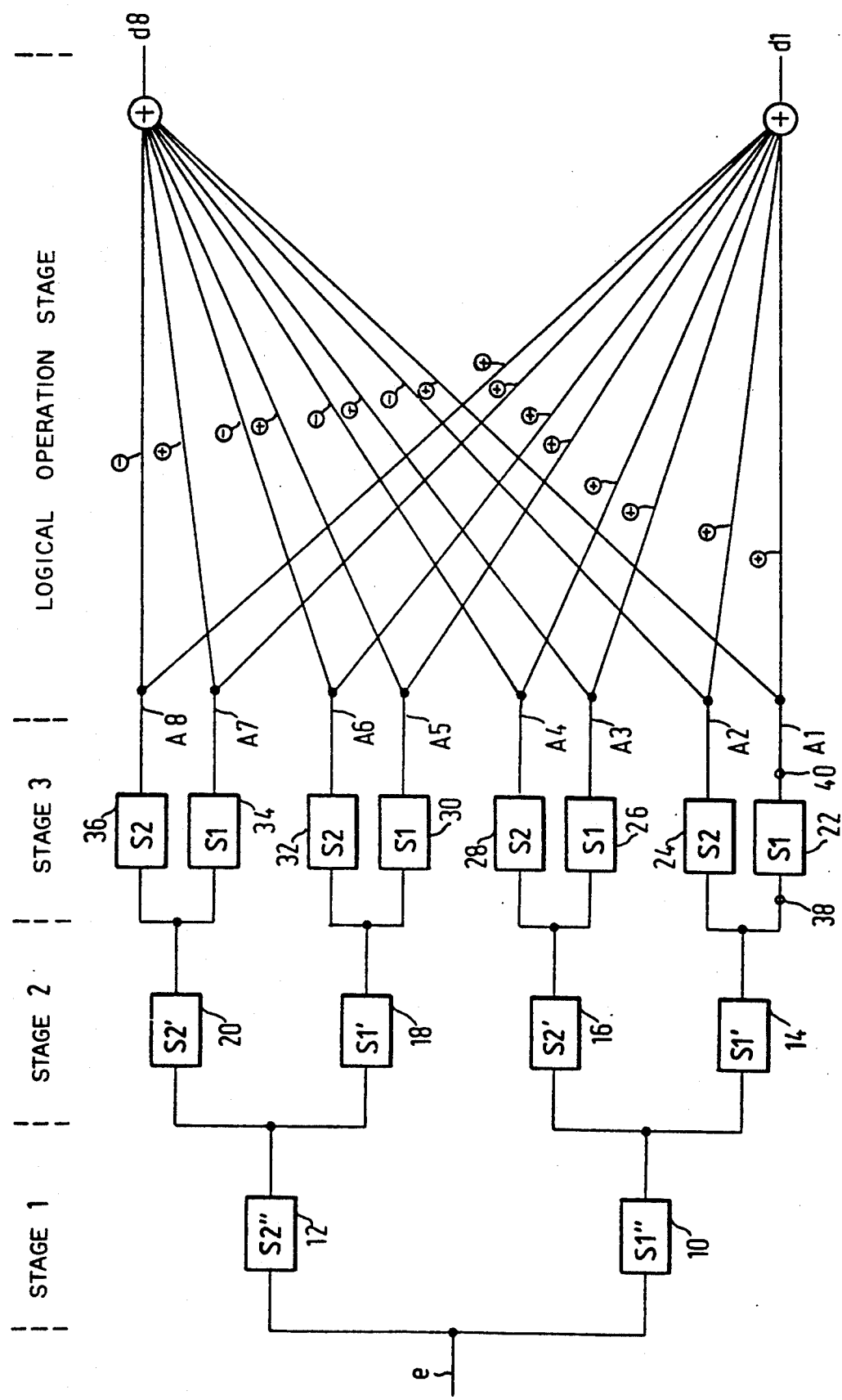
FIG. 1 shows a schematic view of one embodiment of the invention in a block diagram.

According to FIG. 1, a digital input signal e is fed to the all-pass filters 10 and 12 which have been derived by applying the frequency transformation twice. The output signal of the all-pass filter 10 is fed to the all-pass filters 14 and 16 which are a result of applying the frequency transformation once. The same applies to the output signal of the all-pass filter 12, the output of which is directly connected with the inputs of the all-pass filters 18 and 20. The output signals of the all-pass filters 14, 16, 18 and 20 are fed to all-pass filters of the first class, 22, 26, 30 and 34, respectively, and to all-pass filters of the second class, 24, 28, 32 and 36, respectively, which, on the basis thereof, generate output signals A1 through A8.

By means of FIG. 1 it can be seen that the all-pass filters 10 to 36 are interconnected according to a certain scheme, in which in a stage 1 all-pass filters of highest order, in a stage 2 all-pass filters of the next lower order and in a stage 3 all-pass filters of the lowest order are arranged. The number of all-pass filters to be used decreases from stage to stage, wherein in the first stage two all-pass filters and in the ninth stage $2^n$ all-pass filters are provided.

The filter operations necessary for the step-by-step filtering of the digital input signal e in the all-pass filters 10 to 36 are usually executed in a digital computer (not shown). A special version of a digital computer which is especially suitable for the purpose of the digital filtering, is a signal processor. The latter's arithmetic unit is designed such that the arithmetic operations such as multiplication, summation, subtraction and intermediate storage of partial results, which frequently occur, are executed especially fast. Nevertheless, the computing time of the signal processor, required for the filtering, is the technological bottleneck of the digital filtering technology. It is commonly known that the amount of computation increases with increasing filter order. For the present method, this amount of computation is kept low since the filters of highest order are arranged in stage 1, i.e. the number of said filters is reduced to a minimum value. The increase of logical operations in the logical operation stage, on the other hand, is of only minor importance.

After the step-by-step filtering of the input signal e in the digital computer, there are eight output signals A1 to A8 which are combined to form filter output signals in the subsequent logical operation stage by means of summation and/or subtraction order. Only two of the plurality of combination possibilities are represented, which result in the filter output signals d1 and d8. The output signal d8 is obtained by summation of the output signals A1, A3, A5, A7 and subtraction of the output signals A2, A4, A6, A8. The output signal d1 is obtained by summation of all output signals A1 to A8.

Figure 2:
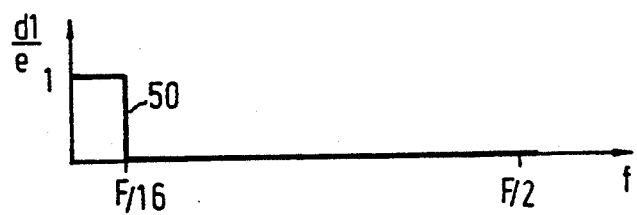
FIG. 2 shows two idealized transfer function operations occurring as a result of the logical operation according to FIG. 1.
Figure 2:
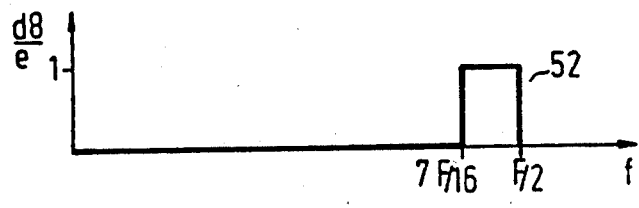

In FIG. 2, two idealized transfer functions d1/e or d8/e are plotted as a function of the frequency f, which show the filter effect on the filter output signals d1 and d8 in case of a logical operation according to FIG. 1. The filter output signal d1 has a frequency curve which corresponds to a low-pass filtering with the filter characteristic 50, the filter output signal d8 has a frequency curve which corresponds to a band-pass filtering with the filter characteristic 52. The cut-off frequencies of the filter characteristics 50, 52 are respectively dependent on the scanning frequency F, by which the discrete input signals e are obtained by analog/digital transformation of an analog signal. Further filter output signals having other filter responses can be obtained by changing the logical operations. Output signals can, for instance, be generated, the respective filter curve of which corresponds to a band pass of the type of the filter characteristic 52, wherein the center frequency fm is $1/32F < fm < 15/32F$.

Figure 3:
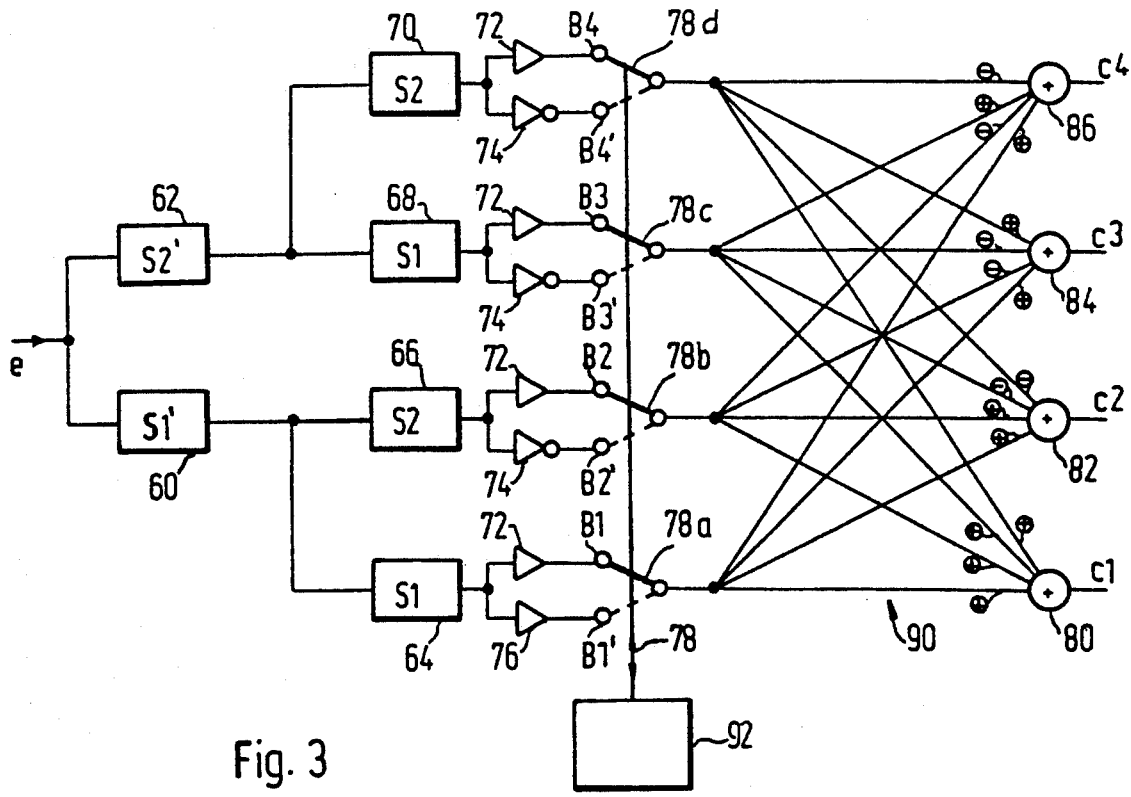
FIG. 3 shows a further embodiment of the invention with controllable logical operation.

FIG. 3, another embodiment according to the invention is shown. The input signal e is filtered in the manner of the filtering already described, in several stages by means of the all-pass filters 60 through 70. In this embodiment, the filtering is carried out in two stages. In contrast to the arrangement shown in FIG. 1, the signals of the all-pass filters of the lowest order 64, 66, 68, 70 are first fed to multiplying elements 72 as well as to negating multiplying elements 74 which generate the output signals B1 through B4 or B2' through B4' by weighting or multiplication by a coefficient b1. The output signal B1' is generated in a different manner, by multiplication of the signal generated by the all-pass filter 64 by a coefficient b2, in a multiplying element 76. The coefficients b1 and b2 can be chosen such that the multiplication thereof by the corresponding output signals is realized by a simple shifting of bit places in the digital computer. This is, for instance, the case for coefficients having the value of 2n with $n = -1, -2, -3, \ldots$. The output signals B1 to B4 or B1' to B4' are fed to a logical operation network 90 via switching elements 78a through 78d of a switching device 78. The switch setting of the switching device 78 is controlled by a filter control 92.

Figure 4:
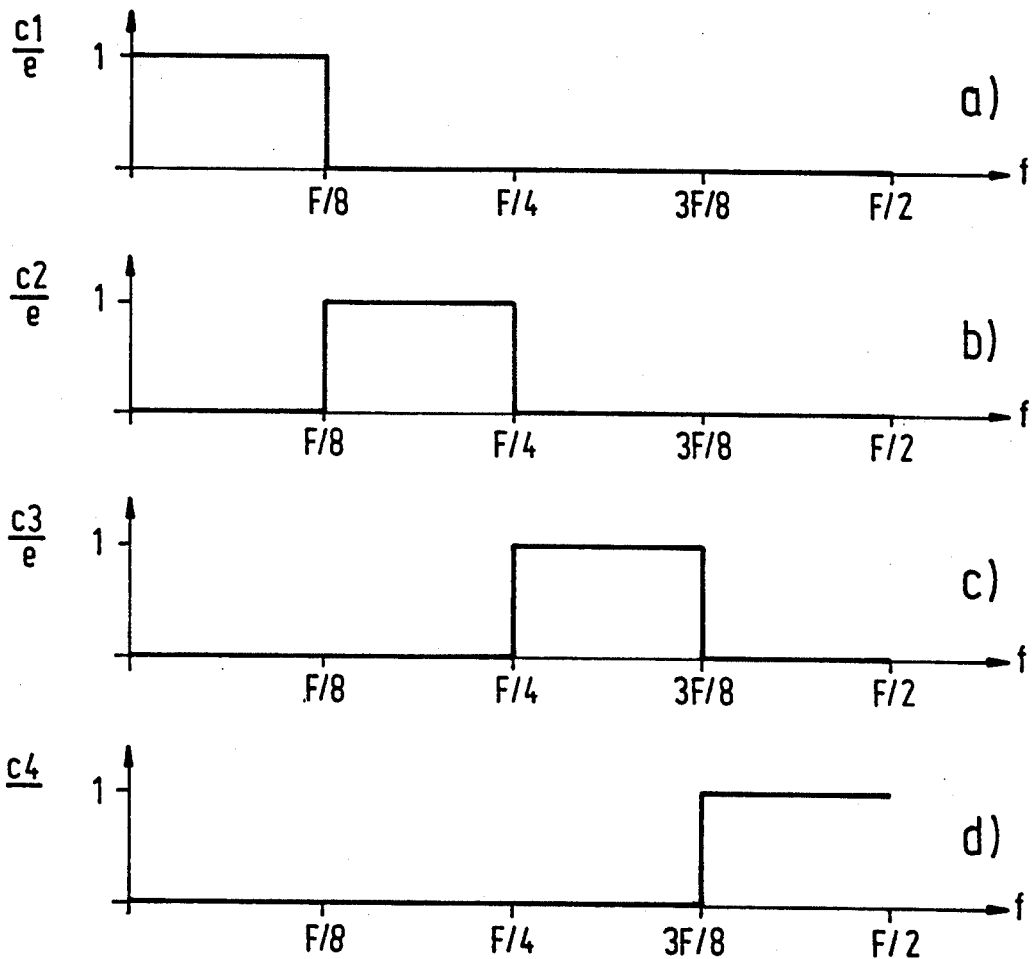
FIG. 4 shows four idealized transfer function operations occurring as a result of the logical operation shown in FIG. 3.

In the switch setting as shown in FIG. 3, filter output signals c1 through c4 are generated by combination of the output signals B1 through B4 in the logical operation network 90 corresponding to the marked sign by using summing elements 80 through 86. The frequency response of output signals c1 through c4 can be seen in the idealized transfer function 5 versus the frequency f, as represented in FIG. 4. The transfer function c1/e in FIG. 4a corresponds to that of a low-pass filter having the cut-off frequency F/8, wherein F1 as already mentioned, is the scanning frequency. The transfer functions c2/e or c3/e, as shown in FIGS. 4b or 4c, correspond to band-pass filters with $F/8 < fd < 2F/8$ or $2F/8 < fd < 3F/8$. In FIG. 4c, the transfer function c4/e is represented, which corresponds to a high-pass filter having the lower cut-off frequency 3F/8. When the coefficients b1 of the multiplying elements 72 are set to the value of ¼, the sum of all effective coefficients equals 1 and, consequently, also the value of the transfer functions c1/e to c4/e in the transfer range is 1. By changing the coefficients b1, the amplitude of the output signals c1 to c4 can be influenced.

When the filter control 92 switches over the switching elements 78a through 78d to the switch setting shown in FIG. 3 by a dashed line, the output signals B1' through B4' are combined by the logical operation network 90 to the filter output signals c1 through c4. When then the coefficients b1 of the inverting multiplying elements 74 are set to the value of ¼ and the coefficient b2 of the multiplying element 76 to the value of ¾, the frequency responses of the filter output signals c1 to c4 as represented in FIG. 4 are reversed, i.e. the low-pass shown in FIG. 4a becomes a high-pass, the band-passes of FIGS. 4b and 4c become band rejection filters, and the high-pass according to FIG. 4c becomes a low-pass. In another embodiment of the invention, which is not shown, the switching elements 78a through 78d can be individually controlled by the filter control 92. Thereby, the respective frequency response of the output signals c1 through c4 can be quickly set as desired without the necessity to intervene in the structure of the logical operation network.

Figure 5:
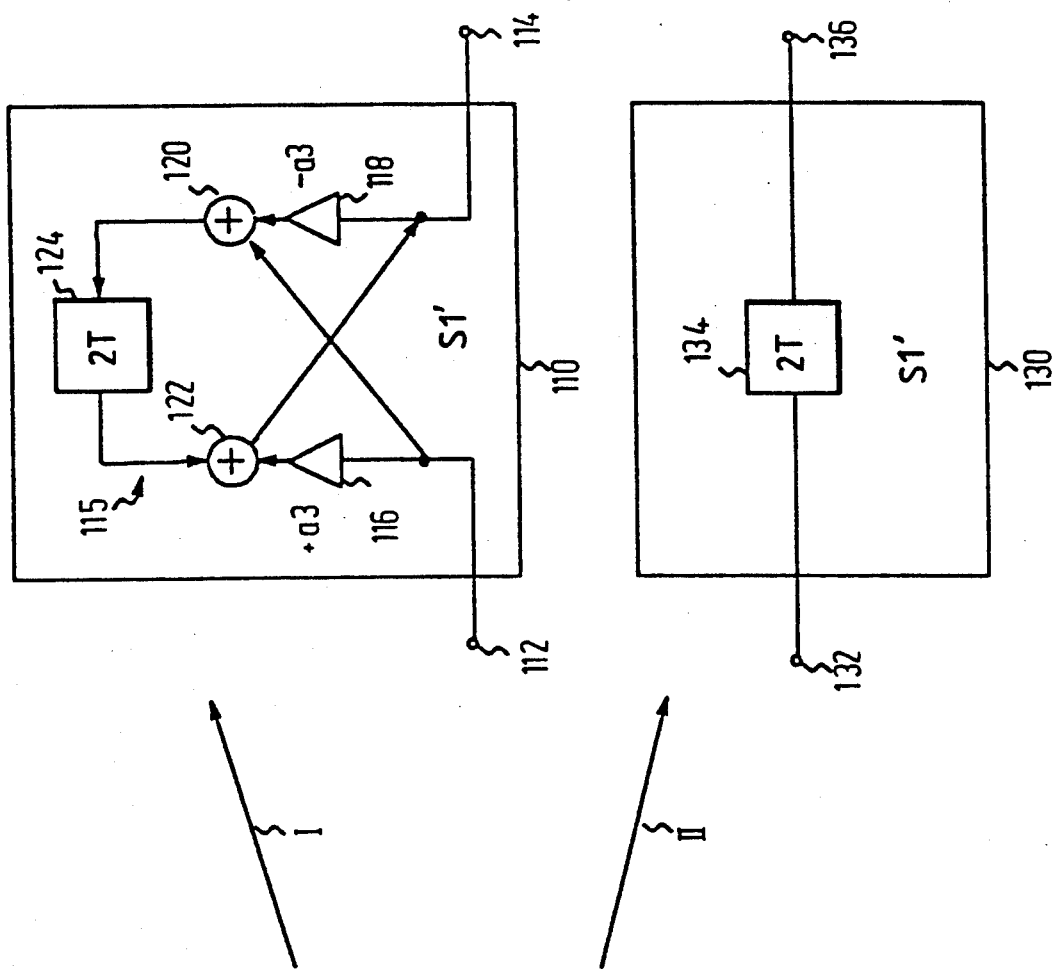
FIG. 5 shows a first-class all-pass filter with the transfer function S1 and all-pass filters of higher order, being derived therefrom.
Figure 6:
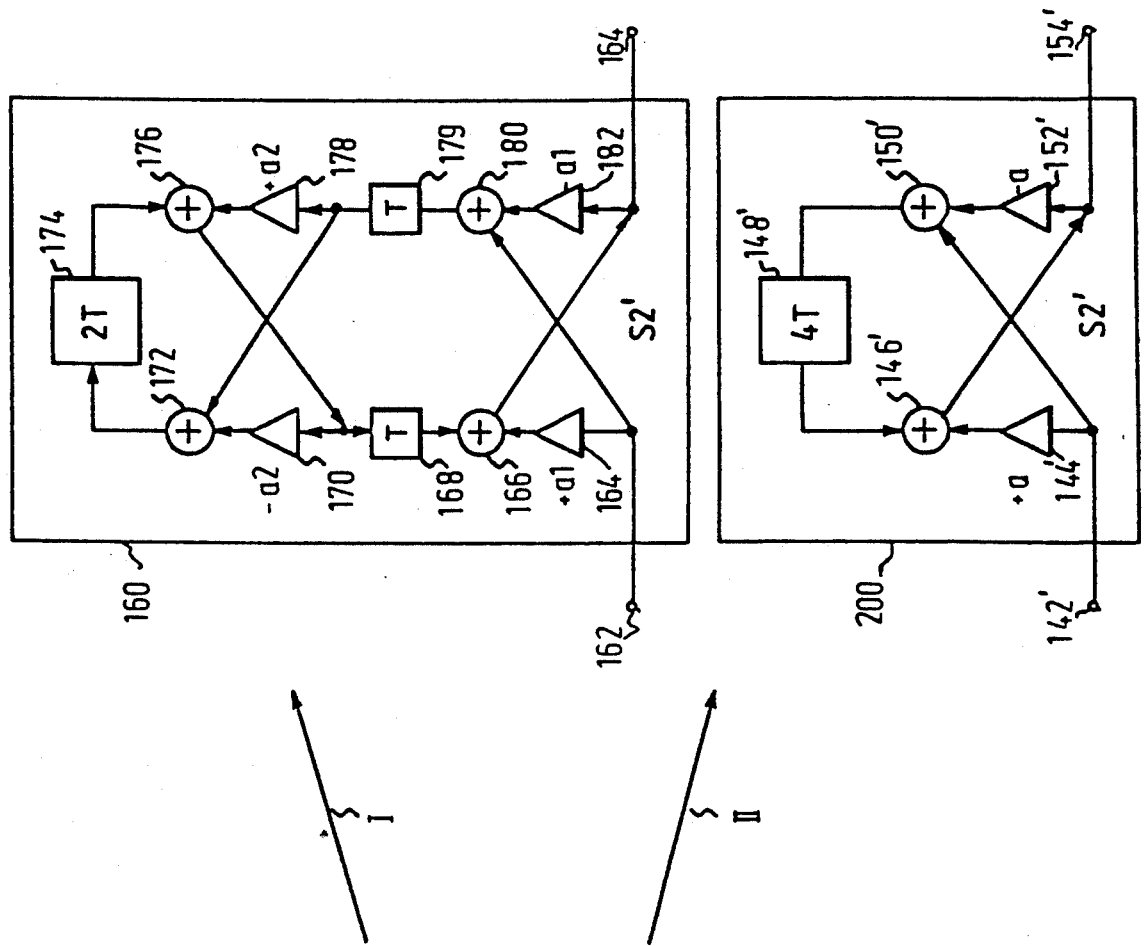
FIG. 6 shows a bireciprocal, second-class all-pass filter with the transfer function S2 and all-pass filters of higher order, being derived therefrom.
Figure 6:
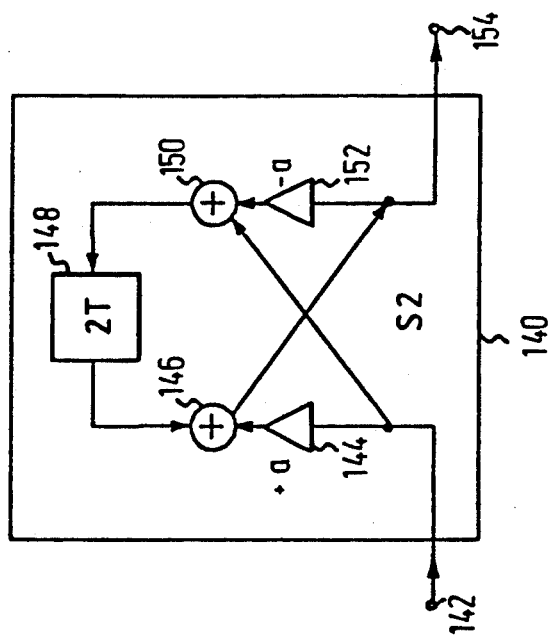

In FIGS. 5 through 7, all-pass filters are shown, which can be used for the step-by-step filtering of the input signal e according to FIGS. 1 and 3. In FIG. 5, first-class all-pass filters 100, 110, and 130 are represented. The response of the all-pass filters is determined by their transfer function. The first-order all-pass filter 100 has a transfer function S1. Between its input terminal 102 and its output terminal 104, a delay element 106 is arranged, which delays a signal fed via the input terminal 102 by a time t, which corresponds to the reciprocal of the scanning frequency F. By using conventional frequency transformations, further all-pass filters of a higher order can be derived from the first-order all-pass filter 100. When using the usual filter transformation, which is indicated by the arrow I, there is obtained a second-order all-pass filter 110 having the transfer function S1', in which a digital filter network 115 is arranged between an input terminal 112 and an output terminal 114. A signal fed via the input terminal 112 is fed to a multiplying element 116, the signal is multiplied by a coefficient a3 and the result thereof is passed on to a summation element 122. By summation, the latter generates a further signal component which is delivered by a delay element 124. That signal component, on the one hand, is fed to the output terminal 114 and, on the other hand, is retransferred via a multiplying element 118 to the net-work 115. The multiplying element 118 carries out a multiplication by a coefficient −a3 and the result thereof is passed on to a summation element 120 which adds to this result the signal which is fed to the input terminal 112. The result is delayed in the delay element 124 by two periods T and then fed to the summation element 122. The frequency transformation used in this example is formed according to the known equation $$z' = (a3z^2 + 1)(z^2 + a3)^{-1}$$

with $$z = e^{pT}.$$

wherein p is the complex frequency and T is the scanning period.

When using another conventional frequency transformation having the regulation $z' = z^2$ (indicated by an arrow II in FIG. 5), there is obtained a second-order all-pass filter 130 having the transfer function S1'. Delayed by two times T; it generates a signal fed to its input terminal 132 to its output terminal 134. The time delay is effected by a delay element 134.

In FIG. 6, bireciprocal all-pass filters of the second-class are shown, i.e. all-pass filters having group delay times mirror-symmetrical to F/4. An all-pass filter 140 has the transfer function S2, the degree of which is higher by one relative to the transfer function S1.

A signal fed to the input terminal 142 is passed on to a multiplying element 144 by which it is multiplied by a coefficient a. The result thereof is fed to a summation element 146 which adds a signal generated by a sum to the output terminal 154 as well as to a multiplying element 152. The latter multiplies the signal by a coefficient −a and passes on the result to a summation element 150, which forms the sum of the signal being fed to the input terminal 142 and of the signal of the element 152. The result is fed to the delay element 148 by which it is delayed by two times T and fed to the summation element 146.

By using frequency transformations, all-pass filters of a higher order can be derived from the first-order all-pass filter 140. By using a first frequency transformation, indicated by the arrow I, the all-pass filter 160 is obtained. The digitized signal fed to the input terminal 162 is passed on to a multiplying element 164 by which it is multiplied by a coefficient a1. The result is passed on to a summation element 166 which adds this to the signal of the delay element 168, delayed by one time T, and which feeds the sum to the output terminal 164 and to the multiplying element 182. The latter multiplies said sum by a coefficient −a1. In a summation element 180, the input signal is added to that result and the sum is delayed by a time T in a delay element 179. The time-delayed sum is multiplied in a further multiplying element 178 by the coefficient a2. The result thereof is added in a summation element 176 to a signal delayed in a delay element 174 by two times T, and the sum thereof is fed to the delay element 168 as well as to a multiplying element 170 by which it is multiplied by a coefficient of −a2, and the result is fed to a summation element 172. The latter adds the above-mentioned result and the output signal of the delay element 179 and feeds the sum to the delay element 174.

By use of the transformation $z' = z^2$ there is obtained the all-pass filter 200. This filter is designed as an analog of the all-pass filter 140 (same components have the same reference characters, additionally having a prime), with the only difference that the delay element 148' delays by four times T.

On the basis of FIGS. 5 and 6 it can be seen that the filter structures of the all-pass filters of higher order are more complex than the ones of a lower order. This is especially true in case of the use of conventional frequency transformations. In the present example, only bireciprocal all-pass filters have been dealt with. But non-bireciprocal all-pass filters can also be used. Even as first-order filters, said non-reciprocal all-pass filters have a more complex design. The higher-order all-pass filters derived by transformation from said filters, have more complex structures with increasing order. In the method according to the invention, the number of higher-order all-pass filters necessary for the filtering is minimized and consequently also the amount of computation. The effect of said advantage increases with increasing order of the all-pass filters.

I claim:

1. A method for filtering a digitized input signal employing a plurality of all-pass filters of a first class and a plurality of all-pass filters of a second class and including all-pass filters of the first class and of the second class and of a predetermined lowest order and all-pass filters of the first class and of the second class and of at least one higher order derived by frequency transformation from filters of the lowest order, the method comprising the steps of:

feeding the input signal to an all-pass filter of the first class and a highest order and to an all-pass filter of the second class and of the highest order;

feeding the output of each filter of a selected higher order to an all-pass filter of the first class and of a next lower order below the selected higher order and to an all-pass filter of the second class and of the next lower order;

executing the step of feeding the output of each filter of a selected higher order to an all-pass filter of the first class and of a next lower order and to an all-pass filter of the second class of the next lower order until reaching all-pass filters of the predetermined lowest order; and combining the outputs of the filters of the predetermined lowest order to generate a filter output signal.

2. The method according to claim 1, wherein the output signals of the all-pass filters of lowest order are weighted with a coefficient.

3. The method according to claim 2, wherein only all-pass filters of the same class are connected in series and the output signal of the all-pass filter of lowest order is weighted with a coefficient, the value of which results in zero when added to the sum of the values of coefficients, of equal value to each other, by which the remaining output signals are weighted.

4. The method according to claim 2, wherein the weighting is carried out with equal coefficients.

5. The method according to claim 2, wherein the weighting is carried out with coefficients, the sum of which equals 1.

6. The method according to claim 2, wherein the weighting is controlled by a filter control.

7. The method according to claim 1, further comprising selectively inverting the output signals of the all-pass filters of the lowest order.

8. The method according to claim 7, wherein the inverting is controlled by a filter control.

9. The method according to claim 1, wherein the all-pass filters of higher order are derived from a frequency transformation $z' = z^2$ with $z = e^{pT}$, wherein p in the complex frequency and T is the scanning period.

* * * * *